United States Patent [19]

Nienart et al.

[11] 4,163,821

[45] Aug. 7, 1979

[54] ADHESIVE BONDING OF METALLIC GLASS FABRIC

[75] Inventors: Louis F. Nienart, Bloomsbury; Gregory J. Sellers, Morristown; Gerald R. Bretts, Livingston; Dirk A. Timan, Morristown, all of N.J.

[73] Assignee: Allied Chemical Corporation, Morris Township, Morris County, N.J.

[21] Appl. No.: 865,453

[22] Filed: Dec. 29, 1977

[51] Int. Cl.$^2$ .............................................. B32B 7/00
[52] U.S. Cl. ................................... 428/245; 427/386; 427/387; 428/261; 428/266; 428/268; 428/365; 428/920
[58] Field of Search ............... 427/386, 387; 428/228, 428/245, 251, 268, 273, 388, 391, 429, 432, 263, 266, 920

[56] References Cited

U.S. PATENT DOCUMENTS

| | | | |
|---|---|---|---|
| 3,367,793 | 2/1968 | Atwell | 428/251 |
| 3,451,886 | 6/1969 | Eakens et al. | 428/251 |
| 4,030,892 | 6/1977 | Mendelsohn et al. | 428/226 |

*Primary Examiner*—James J. Bell
*Attorney, Agent, or Firm*—Horst M. Kasper; Gerhard H. Fuchs

[57] ABSTRACT

An adhesive bonding procedure for providing mechanical stabilization for metallic glass ribbons in fabric form. A curable liquid adhesive is applied to the metallic glass fabric and is cured to adhesively bond overlapping ribbons. The resulting composite shows a high quality appearance and texture of the surface, a high flexibility of the coating on the metallic glass fabric and an ability of the adhesive bond to prevent the fabric from fraying when subjected to flexing and torsioning.

22 Claims, No Drawings

ADHESIVE BONDING OF METALLIC GLASS FABRIC

FIELD OF THE INVENTION

The invention relates to a procss for adhesively bonding metallic glass fabric with plastic compositions for obtaining flexible coatings which provide mechanical stabilization for the metallic glass fabric.

BACKGROUND OF THE INVENTION

Mendelsohn in U.S. Pat. No. 4,030,892 discloses a flexible electromagnetic shield, and such a shield comprises interlaced filaments of at least one glassy metal alloy. The magnetic shielding fabric disclosed by Mendelsohn exhibits magnetic properties very similar to those of commercially available crystalline nickel-iron alloys and with mechanical properties superior to those of commercially available alloys. However, unlike magnetic shields made from conventionally employed magnetic shielding alloys the magnetic shields disclosed by Mendelsohn retain their outstanding magnetic properties even after being strained. However, Mendelsohn's fabric shields are subject to fraying and to breakage upon impact, and when torsioning and twisting forces are applied. There is a need for providing means for stabilizing the magnetic shields disclosed by Mendelsohn against fraying and breakage.

It is an object of the invention to provide a stabilized metallic glass fabric.

It is another object of the invention to provide a flame resistant and stabilized metallic glass fabric.

It is a further object of the invention to provide an electromagnetic shield also blocking infrared frequency radiation.

It is a further object yet of the invention to provide a stable and flexible metallic glass shield.

Further objects of the invention include the provision of a stablized metallic glass shields with uniform surface appearance; of an electrical insulation for the metallic glass fabric; of means for a vibrational damping for a metallic glass fabric; means for stabilizing a metallic glass fabric without crimping the strands; a metallic glass fabric which exhibits permeability or impermeability for fluids; a metallic glass fabric which is protected against galvanic coupling; a metallic glass fabric with a surface film which can be colored; and a metallic glass fabric with a surface which is stable against oxidation and chemical attack. Other objects will become apparent from the following description and claims.

SUMMARY OF THE INVENTION

The present invention provides a method for stabilizing metallic glass fabrics by adhesively bonding together the strands in the fabric by applying a liquid adhesive, followed by curing to the solid state. Cure of the adhesive may be effected by methods such as evaporization of a solvent or diluent therefrom, or by polymerization, etc. Thus, the present invention provides a method for adhesively bonding together the strands in a metallic galss fabric.

The invention further provides a stabilized magnetic shielding fabric composed of strands comprising a glassy alloy of about 75 to 87 atom percent of at least one metal selected from the group consisting of iron and cobalt, up to about three-fourths of which may be replaced by nickel and the balance at least one metalloid selected from the group consisting of boron, carbon and phosphorus, up to about one-third of which may be replaced by an element selected from the group consisting of silicon and aluminum, plus incidental impurities.

DETAILED DESCRIPTION OF THE INVENTION

The flexible electromagnetic shield as disclosed by Mendelsohn retain their outstanding magnetic characteristics even after being elastically strained. The ability to control the interlacing pattern permits fabrication of complex geometric shapes without the attendant costly annealing steps required for commercial crystalline alloys. However, such fabrics may unravel and fray when subjected to flexing and torsioning. We have found that by adhesively bonding together the strands in the fabric mechanical stabilization for metallic glass ribbons in fabric form can be achieved. Unique features of this adhesive bonding include the high quality appearance and texture of the surface, the flexibility of the bonded metallic glass fabric and the ability of the adhesive bonding to prevent the fabric from fraying when subjected to flexing and torsioning. Other desirable features include an adhesive bonding procedure employing an epoxy coating system which has a low enough viscosity to facilitate handling, the capability of such a resin system to cure at room temperature and a convenient time duration for resin pot life and set up times.

The stabilization procedure of the present invention is applicable to metallic glass in fabric form. The present invention is particularly applicable to electromagnetic shields comprising interlaced filaments of at least one metal alloy that is primarily glassy and has a maximum permeability of at least about 20,000 and a coercitivity of less than about 0.08 Oe. As employed in this invention, interlacing includes operations such as weaving, knitting and braiding. Filaments as used herein may be ribbon or wire or other slender bodies whose transverse dimensions are much smaller than its length, having regular or irregular cross-section.

The glassy alloy consists essentially of about 75 to 87 atom percent of at least one metal consisting of iron and cobalt, up to about three fourths of which may be replaced by nickel, and the balance at least one metalloid selected from the group consisting of boron, carbon and phosphorus, up to about one third of which may be replaced by an element selected from the group consisting of silicon and aluminum, plus incidental impurities.

Adhesive materials suitable for bonding metallic glass fabric include organic plastic materials such as resins and polymers. Preferred plastics include silicone resins, epoxized and epoxy resins, polyvinyl chloride, phenolic resins, polyamides, polyethers and polyesters. More preferred coating materials include phenol formaldehyde epoxy and resin blends such as phenolic-vinyl blends, phenolic-polyvinylbutyral, phenolic-polyvinylformal, phenolic butadiene acrylonitrile rubber, polyvinylacetate phenolic resin, neoprene rubber-phenolic resin, nitrile rubber-phenolic resin. Dilution can provide an evaporating component and suitable viscosities, surface tensions and contact angles for the adhesive which bonds the metallic glass.

The plastic materials are preferably diluted with suitable solvents. Such solvents include xylene for silicone resins, 2-butanone for epoxys, benzyl alcohol for epoxys, trifluoroethanol for nylon, tolulene for epoxys, propylene oxide, methylene dichloride, acetone, methyl acetate, chloroform, methanol, carbon tetrachloride, ethyl acetate, ethanol, methyl ethyl ketone, benzene, ethylene dichloride, trichloroethylene, isopropyl acetate methyl methacrylate, nitromethane, dioxane, toluene, nitroethane, butanol, acetic acid (glacial), perchloroethylene, methyl Cellosolve, Cellosolve (2-ethoxyethanol), ethyl benzene, xylene, methyl Cellosolve acetate (2-methoxyethylacetate), ethyl lactate, cyclohexanone, Cellosolve acetate (2-ethoxyethylacetate), diacetone alcohol (4-hydroxy-4-methyl-2-pentanone), diacetone alcohol (4-hydroxy-4-methyl-2-pentanone), -dichlorobenzenes, -diethylbenzenes, butyl lactate, amylbenzene, isophorone, 2-ethylnaphthalene, and other solvents known in the art for particular resins and polymers.

Plastisol composition can also be employed comprising solids dispersions of appropriate resins in suitable plasticizers.

The adhesive bonding resin can be modified with fillers, modifiers, accelerators, wetting agents, blocking agents, diluents, solvents and antioxidants. Further additives may include hardeners for the epoxides; triethylenetetramine and tridimethylaminomethyl phenol as hardeners for modified polyamines and other hardeners, moderators and accelerators known in the art for plastic material suitable in the present invention.

After application of the adhesive material to the metallic glass fabric, it must be cured to the solid state. The adhesive can be cured to an essentially solid state by processes such as drying, polymerization, plasticizer absorption, solidification from a hot melt or evaporation of a dispersant. The type of curing is not critical and a combination of curing methods can be employed. Thermosetting resins result often in strong adhesion.

The adhesive bond to metallic glass is improved for appropriate resins by pressing and by curing at elevated temperatures, e.g., a press may be combined with a heating arrangement.

Generally, overnight curing is preferred which may take place at elevated temperatures for certain times depending on the material used for bonding to the metallic glass. The curing process can be speeded by addition of catalysts and accelerators.

Methods for applying the liquid, durable adhesive composition to the metallic glass fabric include dipping the metallic glass fabric into the liquid adhesive, applying a coating formulation with a brush or roller to the metallic glass fabric, spraying liquid adhesive solution onto the metallic glass fabric, and coating or painting or brushing solution of the adhesive onto the metallic glass fabric. The amount of adhesive applied can be controlled with a coating knife.

The adhesive can be applied by means of various types of coating apparatus e.g. a levelor coater with or without reverse smoothing roll, a knife-over-roll coater, a sequential knife coater, a floating knife coater, a blanket knife coater, an inverted knife coater, a drum cast coater, a metal belt precast coater or a fusion-extrusion coater.

For obtaining patterns on the surface of the coating, an engraved roll coating unit can be employed. An additional step of embossing and printing can be advantageously combined.

We have found that the applied liquid adhesive moves into the spaces between overlapping ribbons. Such movement is largely determined by capillary forces and surface activity. Metallic glasses are high energy surface materials. A liquid or solid forms an adhesive bond by molecular attraction. The bonding liquid must wet the surface of the solid and must be flowable.

The contact angle theta of the liquid or the solid is a good inverse measure of wetting and spreadability and hence of adhesion. When the contact angle theta is 0, the liquid wets the surface completely. When the surface tension of the liquid is below a critical value than the contact angle is zero. At the phase boundary the three surface tensions liquid—metallic glass, liquid—ambient gas and ambient gas—metallic glass must be in static equilibrium.

In the present invention a resin solution is preferred which has a contact angle between 0° and about 30°. More preferred, the contact angle is between about 0° and 10°. The surface tension of the adhesive can be between about 15 and 100 dyn/cm and preferably between 18 and 30 dyn/cm.

For example, polydimethylsiloxanes spread on high energy surfaces because surface tensions of about 18-21 dyn/cm are always less than the critical surface tensions of wetting of their own adsorbed films.

A liquid resin based adhesive of suitable viscosity by means of solution, emulsification or melting of the resin can be provided, e.g., means for increasing the viscosity of the liquid resin include drying of solvents, cooling of a melt, polymerization of a monomer or crosslinking. The adhesives suitable in the present invention have a viscosity of between about 0.3 cp and 10 cp and preferably between 0.3 cp and 1 cp.

In general, there is no direct relationship between viscosity and surface tension. However both properties cooperate in providing a material suitable for adhesive bonding. A compromise is necessary in providing a formulation having desirably a high solids content, and simultaneously sufficiently low surface tension and viscosity as to let the adhesive flow into the narrow crevices between filaments of the fabric.

The bonding of the metallic glass strands can be also improved by roughening their surface. Mechanical roughening can be obtained by mechanical contact with materials harder than the strand. The surface roughness can also be increased by chemical treatment of the strand in a pickling or scaling bath. Acid scaling baths are preferred, e.g. aqueous solutions containing sulfuric acid and dichromate ions.

Removal of grease from the surface of the strands also enhances the adhesive bond. Grease can be removed with good solvents for fatty materials, e.g. trichloroethylene.

While metallic glass fabric itself can be frayed and exhibits limited impact strength, the adhesively bonded metallic glass fabric exhibits good impact and tensile strength without a tendency to fray. The good magnetic shielding properties of the unbonded fabric are made more permanent by the adhesive bonding process which prevents shifting of the strands which make up the fabric. The adhesively bonded fabric exhibits in addition stronger vibrational damping compared to the unbonded fabric.

If desired, the liquid adhesive can be applied in amount sufficient and in a manner to cover the openings in the fabric to make it impermeable to gases and liquids and inhibit air convection.

Adhesive bonding of metallic glass fabric leads to stabilization without crimping and cold working. The adhesive bonding procedure can be applied to metallic glass fabric which has been shaped into any desired form and serves to stabilize such form. An adhesively bonded metallic glass fabric with a remaining cured film of adhesive covering the surface of the fabric also exhibits lower diffusive heat transfer than pure metallic glass fabric. Presence of cured residual adhesive on the surface of the metallic glass fabric results in diminished galvanic coupling with other metals with which it may come into contact. The residual adhesive on the surface of the metallic glass fabric also lowers the surface friction considerably by covering the sharp edges of the metallic glass strand. When a suitable cured adhesive film remains on and covers the surface of the metallic glass fabric, then this fabric is useful for simultaneously providing magnetic shielding and electrical insulation.

The adhesive film coating has an attractive appearance. If properly prepared it is free of extraneous material such as dust, dirt, fiber, etc. and smooth with no bubbles and does not exhibit grain structure. The adhesive bonding coating may be applied to either one or both sides of the metallic glass fabric. In one sided application the side of the metallic glass fabric can be free from adhesive with no visible smear stains, runs or blemishes due to cooling.

The adhesively bonded fabric is stable so as to be protected against distortion of the weave or fraying of the fabric. Preferably, the adhesively bonded fabric can be bent over an about 1 cm radius, with coated side out without coating failure, i.e., cracking, flaking off, etc. Preferably, the adhesively bonded fabric passes the fraying test wherein a 25 cm × 17½ cm piece of fabric is rolled and unrolled for 30 times over a 1.25 cm diameter cylinder with the same side towards the outside wherein after 10 times there is no unravelling and after thirty times, not more than one strand loss.

For decreasing flammability of the adhesively bonded metallic glass fabrics several steps may be taken. The amount of adhesive applied can be minimized so as to restrict it to the area where bonding is effective between overlapping filaments of the fabric and/or by removing excessive adhesive from the surface of the fabric as by scraping it off or by redissolving. Flammable adhesive bonding compositions can be modified to decrease flammability by incorporation of flame retardant materials, e.g. a bromine containing additive along with an antimony synergist can be employed. A preferred additive to introduce bromine into many types of plastic formulations at the present time is decabromobiphenyl oxide. This material can be used, in combination with antimony oxide as a synergist, in plastic formulations.

With regard to the antimony halogen (bromine or chlorine) flame retardant systems, wherein the antimony is supplied in the oxide form, it is important to note that the antimony oxide in itself, in most cases, significantly improves the flame retardant characteristics of the formulation. It does so by changing the nature of the chemical reactions that occur in the burning process. The latter point is important because the changes in the flame chemistry also result in significant changes in the nature of the gases evolved during burning.

Epoxy adhesive formulations containing decabromobiphenyl oxide and antimony oxide additives provide marginally acceptable flammability characteristics without severely degrading the physical properties of the coating.

Polyvinyl chloride is inherently flame retardant because of its high chlorine content (approximately 57%).

When used with an antimony synergist, polyvinyl chloride in the form of coatings shows excellent flame retardant characteristics even when compounded with flammable (non-phosphate) plasticizers. Vinyl resins do not represent a significant toxicity hazard. The vinyl resins are also low in cost. Preferably, they are applied in solution form. Dispersions of vinyl resins, such as aqueous latices are also suitable. Vinyl solutions are easy made up and applied, do not have the pot life limitations of a room temperature curing epoxy system, and certain vinyl copolymers have good physical properties. The adhesion of vinyl resins to metallic glasses is generally very good. Fluorocarbon resins and neoprene-like materials also provide flame retardant polymers for adhesive bonding of metallic glasses.

Adhesive bonding can also be effected with organic polymers in aqueous latex form. A polyvinyl chloride emulsion suitable for that purpose is obtainable as Geon Latex 652 from B. F. Goodrich Chemical Company, Akron, Ohio. Neoprene latices are obtainable as E 10784-398, E 10784-397 and E 10784-396 from DuPont Company, Wilmington, Delaware. A polyvinylidene chloride emulsion is obtainable as Daran 220 from Polymers and Chemical Division of W. R. Grace and Co., New York, New York.

Use of water-based emulsions is desirable because they involve reduced ecological and flammability hazards during application, and they are lower in cost.

Latex-produced films form good adhesive bonds with metallic glass. Neoprene latices produce very flexible films. Likewise, use of polyvinyl chloride latex results in a strong adhesive bond and provides bonded metallic glass fabric having good flexibility. The polyvinyl chloride latex forms an adhering film on metallic glass, although the film tends to be somewhat brittle, which can be overcome by addition of a plasticizer.

The bonded magnetic shields of the present invention have a multiplicity of uses. They are suitable for all uses to which the flexible electromagnetic shields disclosed by Mendelsohn et al. are suitable. For example, the shields of the present invention are suitable for shielding rooms against intensive electromagnetic radiation, for electromagnetically shielded inflated temporary buildings, for improving static dissipation and for microwave antennas.

In the following examples parts and percentages are by weight unless otherwise indicated.

EXAMPLE 1

Metallic Glass Fabric with Epoxy Coating

A plain weave metallic glass fabric about 1 m wide metallic glass strands in both warp and filling yarn composed of $Fe_{40}Ni_{40}P_{14}B_6$ (atomic percent) was placed on a working surface and unrolled for about between 1 and 2 meters. Adhesive tape made of attached across the width of the metallic glass fabric about 20 cm from the roll and the length of the fabric was cut off by cutting through the center of the adhesive tape. In a chemical work hood paper was placed on the working surface. The cut off piece of the metallic glass fabric was placed on the paper. 210 grams of chilled epoxy coating mixture Devcon 5 minute epoxy were prepared by using equal parts of resin and hardener, 40% methylethyl ketone and 0.25 ml of a fluorescent dye. The mixture was stirred for about 4 minutes and the epoxy mixture was poured into a chilled shallow pan from which it was applied to one side of the fabric by means of a prechilled paint roller. The coating was then brushed in order to smoothen the surface. Evenness of coverage of the metallic glass fabric with the coating material was checked with ultraviolet light and corrected where necessary. The metallic glass fabric so coated was hung to cure. The curing time was about one hour. For a better coating, the previous steps were repeated on the metallic glass fabric. The coated fabric was allowed to cure for about ¾ of an hour in a hood. The cured coated fabric was trimmed to desired size using scissors. The edges of the fabric were trimmed with scissors to a width of about 20 cm. Sheets of cured coated metallic glass fabric prepared as described above were stacked flat with brown craft paper separating the sheets.

The epoxy coating solution employed was maintained at 8° C., at which temperature it had a pot life of 30 minutes in the example above. The coated surface were found free of foreign matter, such as lint, dirt or brush bristles. The edges of the coated fabric as prepared were free of sharp and protruding ribbon ends.

A suitable test for the coated metallic glass fabric involve bending it over a 1.25 in. diameter roll with the coated side out without observing a coating failure. When the edge of the fabric is subjected to bending forces, no unraveling of the fabric should be visible. The fabric as described above passed this test. The uncoated side of the fabric was substantially free of the coating material as visually observed under ultraviolet radiation.

The same type of fabric was also employed in all other following examples.

EXAMPLE 2

Metallic Glass Fabric with Silicone Coating

Generally following the procedure of Example 1 a silicone resin was applied to the surface of the metallic glass fabric by dipping. The resin employed silicone was Dow Cornings No. R4-3117 resin; it was employed together with Dow Corning's catalyst XY-176. The silicone resin was diluted with xylene to 37 weight percent silicone to reduce the thickness of the coating. The resin was first blended with 1/200th parts by weight of the XY-176 catalyst to speed the curing process. The metallic glass fabric was dipped into the premixed solution after being ultrasonically cleaned in trichlorotrifluoro ethane sold under the trademark GENESOLV ® by Allied Chemical Corporation and the excess material was allowed to drip off. The thickness of the untreated fabric averaged about 0.12 mm and the coated thickness of the cured, coated fabric was about 0.15 mm. Therefore, a layer of about 12 micron of the resin was applied to all surfaces.

EXAMPLE 3

Testing of Coated Metallic Glass Fabric

Test strips 2.5 cm wide and 11.25 cm long are cut from the bonded metallic glass fabric. The metallic glass fabric is cut diagonally to the orthogonal directions of the woven fabric ribbons. The samples are tested under tension to measure the elongation to the first "break." The load to the first "break" was in pounds as shown in Table 1. The formulation used for coating the metallic glass ribbon fabric were as indicated on the left side in Table 1. The gauge length was 5 cm and the head speed was 1.2 cm per minute. The chart speed employed was 12.5 cm per minute. The tester is a commercial tester provided by Instron Instruments, Inc. and is generally used for testing in tension.

Table 1

| Ex. | Sample | Ultimate Elongation UE (%) | Breaking Load (lbs) | Quality |
|---|---|---|---|---|
| 1 | Devcon 5-min. Epoxy | 1.3 | 26.7 | very |
|   |  | 1.4 | 26.6 | good |
| 2 | R4-3117 (silicone) | — | 24.8 | acceptable |
|   |  | 0.6 | 25.2 |  |
| 5 | Epon 871 + EH-30 | 0.9 | 5.6 |  |
|   | +3-80C calender | 0.9 | 6.3 |  |
| 7 | Epon 871 + Epon 828 | 1.3 | 6.8 |  |
|   | (Dion 3-800 Brush) | 1.3 | 7.2 |  |
| 8 | Epon 871 + EA-30(c) | 0.9 | 6.4 |  |
|   |  | 0.9 | 6.4 |  |
| 9 | Epon 871 + Epon 828 | 1.4 | 4.7 |  |
|   | + Dion 3-800 + EH-30 (B) | 1.5 | 5.0 |  |
| 10 | Epon 871 (+13% Teta) | — | 10.2 |  |
|   |  | 1.2 | 10.2 |  |
| 11 | Epon 828 + Epon 871 | 0.5 | 17.1 |  |
|   | + EH-30 (Roller) | 0.5 | 19.1 |  |
| 13 | New Formulation Flame Retardant Coating 37-200 | 1.3 | 60.2 | good |
|   |  | 1.3 | 58.8 |  |

EXAMPLE 4

An epoxy blend of Epon 871 and Epon 828 made by Shell was prepared. Epon 871 is an aliphatic type with higher esters and Epon 828 is an epoxy of the bisphenol-A type. The formulation employed was 100 parts by weight of 80% Epon 871 and 20% of Epon 828, 75 parts of 85% of Dion 3-800LC and 15% benzyl alcohol. Dion-3-800LC is an aliphatic mercaptan terminated material. In addition, 6 parts of EH-30 which is a tertiary amine were added to the formulation. The Dion 3-800LC and EH-30 were supplied by the Diamond Shamrock Chemical Corporation. The gel time for this formulation was about 5 minutes and the reaction was moderately exothermic at room temperature. The resin was calendered onto the fabric and the resulting coating was brittle.

EXAMPLE 5

100 parts by weight of 50% Epon 871 and 50% Epon 828 were mixed with 75 parts of a mixture of 85% Dion 3-800LC and 15% benzyl alcohol with 6 parts of EH-30. The mixture was applied to the metallic glass fabric. The gel time was again 5 minutes and the reaction was highly exothermic. The liquid resin mixture was calendered on the fabric. The resulting coating was brittle.

EXAMPLE 6

100 parts of 20% Epon 871 and 80% Epon 828 were mixed with 75 parts of 85% Dion 3-800LC and 15% benzyl alcohol with 6 parts of EH-30. The mixture was applied to the metallic glass fabric. The gel time was 5 minutes, the reaction was highly exothermic, and a brittle coating resulted.

EXAMPLE 7

17 parts of Epon 871 were mixed with 1 part of EH-30 and 12 parts Dion 3-800LC. The mixture was applied to the metallic glass fabric. The gel time was 2 and ½ hours at room temperature. Even after 24 hours curing time at room temperature no substantial cure was observed.

EXAMPLE 8

22 parts of Epon 871 were mixed with 1 part EH-30 as a coating. The mixture was applied to the metallic glass fabric. The gel time for the coating was 4 hours. After applying the gel to the metallic glass fabric even after 24 hours at room temperature no substantial cure was observed.

EXAMPLE 9

100 parts of 80% Epon 871 and 20% Epon 828 were mixed with 100 parts of DS 3-800 and 10 parts of EH-30. A moderately exotherm reaction resulted. The mixture was applied to the metallic glass fabric. There was a gel time at room temperature of about 50 minutes. Curing after 24 hours at room temperature was incomplete.

EXAMPLE 10

Epon 871 was blended with hardeners tetraethylenetetramine (TETA) and EMP-30 tridimethylaminomethyl phenol. The formulation was 100 parts resin and 12 parts hardeners. The metallic glass fabric was coated by calendering, and curing was obtained by heating for 24 hours at 140° C. The coating was slightly discolored. Flexing the coated metallic glass fabric resulted in unraveling.

EXAMPLE 11

Epon 828 was blended with Epoxide 711, a trifunctional aliphatic epoxide, produced by the Diamond Shamrock Corporation and mixed with hardener EH-30. The formulation was 100 parts Epon 828, 20 parts of the Epoxide 711, and 6 parts EH-30. The fabric was roller coated with the mixture. Room temperature cure occurred in less than 20 minutes, followed by post cure at 100° F. for 2 hours. Flexing the metallic glass fabric resulted in raveling and a brittle coating was observed.

EXAMPLE 12

A metallic glass fabric was coated with Eccocoat VE made by Emerson and Cuming, Incorporated, Canton, Massachusetts. This was employed as a 2 component system with the proportions of 1 part A and 1.5 parts B. Part A is a bisphenol-A type resin and part B is a polyamide. The mixture was diluted with toluene to reduce its viscosity for brush painting. It was applied to one side only and the thickness of the coating was about 25 microns. The sample looked very good and at least equal to the look of Devcon 5 minute epoxy coating. The coating was strong and flexible at the same time. The curing took place at room temperature overnight and was followed by 2 hours at 78° C. in an oven.

EXAMPLE 13

Flame Resistant Coating

A resin "Epotuf 37-200" manufactured by Reichhold Chemical Corporation was employed. The Epotuf epoxy 37-200 is a diglycidyl ether of tetrabromyl bisphenol-A. A hardener was used which is a modified polyamide and sold by the Reichhold Chemical Corporation under the No. 37-622. The formulation was 100 parts resin and 22 parts hardener. The viscosity of the mixture at room temperature of the resin was at 77° C. 5-10,000 poise. Blended with the hardener the mixture was too viscous and 25% by volume of toluene was added. The resulting solution was brushed on metallic glass fabric. The material was cured at room temperature overnight with 1 additional hour at 75° C. The fabric thickness was found to be about 0.15 mm. The coating was found to be brittle.

EXAMPLE 14

The coating process as described in Example 13 was modified by adding to the formulation 5.5 weight percent of diethylaphthallate. This mixture was then brushed on the fabric. The resulting coating is strong and comparable to the coating of Example 1. For best results, the resin 37-200 should be blended with another resin to reduce total bromine content.

EXAMPLE 15

Nylon-6 was dissolved in trifluoro ethanol at room temperature for an 8.3 by weight percent solution. This solution was diluted with trifluoro ethanol for 2% by weight solution which had a viscosity suitable for dipping. A fabric piece of 15 by 17.25 cm was cut and dipped into the solution and allowed to drip dry. The coating was a white film of nylon. The bond of the film to the metal was found to be poor. Bonding to the metallic glass was poor, the fabric was not stabilized.

EXAMPLE 16

A mixture was prepared consisting of VMCH made by Union Carbide (Bakelite carboxylated vinyl resin) 15 weight percent, tricresylphosphate from Monsanto 3 weight percent, dioctylmaleate (thermolite 813) from M and T Chemicals 0.5 weight percent, xylene, technical grade 40 weight percent, and methylisobutyl ketone, technical grade 42 weight percent. The VMCH resin is a vinyl copolymer containing about 87% vinyl chloride, 12% vinyl acetate and less than 1% maleic anhydride.

This formulation is a presently preferred mode and appears to meet physical property requirements for the coating and, when coated on the metallic glass passes the UL subject 94 V-O rating. Toxicity with the coating as formulated is not a problem. If desired, the tricresyl phosphate (TCP) plasticizer used may be replaced with a non-toxic plasticizer such as Santicizer 141 or Santicizer 143 made by Monsanto. The versatility of the VMCH system lies in the fact that it can be used plasticized or unplasticized and can be used with or without antimony oxide as a synergist and still pass all requirements of forming a strong adhesive bond with metallic glass. The above-described adhesive formulation was applied to a metallic glass fabric and dried. An excellent bonded and coated stabilized metallic glass fabric resulted. The disadvantages include the fact that the vinyl coating has more limited elevated temperature stability than the epoxy or fluorocarbon formulations. Also, it must be applied at low solids (20-25% maximum) concentration; therefore, a large amount of solvent is required. This solvent represents a major cost item as well as potential pollution problem.

Table 2

| Ex. | Adhesive Bonding Formulatons | weight percent |
|---|---|---|
| 17 | VHCH | 10.5 |
|  | Xylene | 37.9 |
|  | Methyl Isobutyl Ketone | 51.5 |
| 18 | VMCH | 10.4 |
|  | Xylene | 37.5 |
|  | Methyl Isobutyl Ketone | 51.0 |
|  | Antimony Oxide | 1.0 |
| 19 | VMCH | 7.50 |
|  | Tricresyl Phosphate | 1.50 |

Table 2-continued

| Ex. | Adhesive Bonding Formulatons | weight percent |
|---|---|---|
|  | Tin Maleate | 0.25 |
|  | Xylene | 37.60 |
|  | Methyl Isobutyl Ketone | 53.10 |
| 20 | VMCH | 7.50 |
|  | Tricresyl Phosphate | 1.50 |
|  | Tin Maleate | 0.25 |
|  | Xylene | 37.60 |
|  | Methyl Isobutyl Ketone | 53.10 |
|  | Antimony Oxide | 1.00 |
| 21 | Devcon 5 minute Epoxy | 21.1 |
|  | Devcon 5 minute Hardener | 15.8 |
|  | Methyl Ethyl Ketone | 63.2 |
| 22 | Devcon 5 minute Epoxy | 20.1 |
|  | Devcon 5 minute Hardener | 15.1 |
|  | Methyl Ethyl Ketone | 60.3 |
|  | Decabromodiphenyl Oxide | 3.0 |
|  | Antimony Oxide | 1.5 |
| 23 | Reichhold Epoxy (Brominated 37200) | 25.6 |
|  | Reichhold Hardener (37625) | 12.8 |
|  | Methyl Ethyl Ketone | 59.0 |
|  | Antimony Oxide | 2.5 |
| 24 | Pelmor Spray Viton |  |
| 25 | Viton B | 7.9 |
|  | Lead Mono-Oxide | 0.9 |
|  | Methyl Isobutyl Ketone | 52.7 |
|  | Xylene | 20.0 |
|  | Triethylene Tetramine | 0.1 |
| 26 | Viton B | 6.7 |
|  | Lead Mono-Oxide | 1.0 |
|  | Hydrated Alumina | 1.0 |
|  | Triethylene Tetramine | 0.1 |
|  | Methyl Isobutyl Ketone | 52.8 |
|  | Methyl Ethyl Ketone | 18.2 |
|  | Xylene | 20.0 |
| 27 | Neoprene W | 6.6 |
|  | Antimony | 0.6 |
|  | Zinc Oxide (Stabilizer) | 0.4 |
|  | Magnesium Oxide (Stabilizer) | 0.3 |
|  | Akro Flex (Anti Oxidant) | 0.2 |
|  | Lead Mono-Oxide | 1.0 |
|  | Methyl Isobutyl Ketone | 52.5 |
|  | Methyl Ethyl Ketone | 18.1 |
|  | Xylene | 19.9 |
|  | Trimene Base | 0.4 |
| 28 | K. J. Quin Polyurethane PS-26 | 2.4 |
|  | Decabromodiphenyl Oxide | 2.6 |
|  | Antimony Oxide | 0.9 |
|  | Tetrahydro Furan | 47.1 |
|  | Methyl Isobutyl Ketone | 47.1 |

EXAMPLES 17–20

The basic VMCH formulation consists of the resin dissolved in mixed solvent of methyl isobutyl ketone and xylene (see Table 2). The xylene is a diluent rather than a true solvent for the resin and the formulation should be made up by first wetting the resin with the xylene and then adding the methyl isobutyl ketone. This procedure prevents clumping which would occur if the methyl isobutyl ketone solvent were added directly to the powdered resin.

For all vinyl formulations, it was preferred to add a stabilizer. Tin maleate available commercially from M & T Chemicals Inc. as Thermolite 813 was used. This material significantly improves the elevated temperature stability of the coating.

The solids content of the formulation as applied with a DeVilbiss TGA spray gun, which is a fine finishing gun, was limited to about 10 percent solids in order to obtain a smooth coating. At this solids concentration repeated passes were required to achieve a 1½ to 2 mil coating. If 10 to 20 percent of a high boiling solvent such as diacetone alcohol or Cellosolve Acetate is included in the solvent mix, the solids content can be increased and heavier coats applied to reduce the number of passes required to build up a 1½ to 2 mil thickness. The higher boiling solvents will, of course, extend the drying time at ambient temperature. Other modifications of the solvent blend may be necessary to optimize the formulation for a particular type of spray application equipment. A formulation low in solids improves capillary flow between the overlapping parts of the ribons and increases adhesive bonding area.

In order to make the VMCH formulation more flexible so that it will have less stiffening effect on the metallic glass fabric, it can be plasticized with conventional vinyl plasticizers. In order to retain optimum flame retardant characteristics, the plasticizer used in the formulation was tricresyl phosphate. Alternative plasticizers which are just as effective include two ethyl-hexyl diphenyl phosphate (Monsanto Santicizer 141) or a proprietary phosphate plasticizer Santicizer 143.

The tests of Table 3 include:
Burning or flammability tests according to UL Subject 94 Vertical test procedures.

Table 3

| Ex. | Coating | Burning 1 | Roll Bond (30 rolls) | Flex Bond | Soldering 2 | Color |
|---|---|---|---|---|---|---|
| 17 | VMCH | 4 | 5– | 4– | Burns off coating | Clear |
| 18 | VMCH + $Sb_2O_3$ | 4+ | 5– | 4– | Burns off coating | Clear |
| 19 | VMCH + Plasticizer | 4– | 5 | 4 | Burns off coating | Clear |
| 20 | VMCH + Plasticizer + $Sb_2O_3$ | 4+ | 5 | 4 | Burns off coating | Clear |
| 21 | Devcon 5 min Epoxy | 1 | 5 | 4 | Browns | Clear |
| 22 | Devcon 5 min + DBBPO + $Sb_2O_3$ | 3 | 5 | 4 | Browns | Clear |
| 23 | Brominated Epoxy + $Sb_2O_3$ | 4 | 5 | 4 | Browns | Clear |
| 24 | Pelmor Spray Viton | 5 | 5 | 4 | Good | Black |
| 25 | Viton | 4 | 5 | 5 | Browns | Tan |
| 26 | Viton + F. R. Additive | 4 | 5 | 5 | Browns | Tan |
| 27 | Neoprene | 4– | 5 | 4+ | Browns | Tan |
| 28 | Polyurethane | 4– | 5 | 4 | Browns | White |

1 Rating based on a scale 1–5 with 5 representing excellent rating and 1 a poor rating.
2 The METGLAS by itself turns brown upon soldering A roll bond test in which the coated fabric was rolled around a ⅛" diameter rod 30 times and evaluated for loose strands.

A flex bond test which involved bending one edge into a sharp radius curve and rolling the sharp radius back and forth along one edge of the fabric five times.

A soldering test in which solder was applied to the reverse side of the metallic glass and the effect on the coating was noted. All numerical ratings are based on a scale 1–5 with 5 representing an excellent rating and 1 a poor rating.

The plasticized or unplasticized VMCH formulation easily passes the UL 94 V-O requirements. However, antimony oxide may be added to the formulation to further reduce flammability and/or alter the nature of any combustion gases that are generated. A very fine particle size antimony oxide sold commercially by Nyacol Inc. as Colloidal Antimony Oxide Grade A-1588 can be used. This antimony oxide is more expensive than conventional grades of antimony oxide but it has the advantage that is disperses readily in the solution (can be stirred in) and has very low pigmentation characteristics so that nearly clear coatings are obtained. Conventional antimony oxides would have more of a pigmentation effect and might have to be milled into solvent as a master batch before dispersion in the adhesive bonding solution.

The vinyl resin formulation can be readily pigmented to any desired color. In some pigmentation tests, several different paste dispersions of blue pigments were utilized. The preferred dispersion is PMS (Plastic Molders Supply) Epoxy Dispersion ED3000. This is a blue pigment dispersed in a epoxy resin. It readily stirs into the vinyl formulation and the epoxy resin used as the dispersion medium will act as an additional stabilizer for the vinyl resin. The pigment dispersion is 47% solids and it was found that 10% of the dispersion based on the resin solids in the formulation provides a deep blue coloration.

EXAMPLES 21–28

The formulations were prepared as set forth in Table 2. Pelmor is a commercially sold formulation available from Pelmor Laboratories. Vilton is a fluorocarbon rubber produced by DuPont. A similar product is Fluoroel produced by 3M Company. Neoprene is chlorine containing rubber. They were sprayed on a metallic glass fabric in the fashion described for Examples 17–20. The resulting adhesively bonded metallic glass fabrics had the properties as shown in Table 3.

The results indicate that suitable formulations based on brominated epoxy systems preferably with an antimony oxide synergist can be formulated for adhesive bonding of metallic glass. These systems have the disadvantage compared with the vinyl that they are curing systems and have a limited pot life after they are mixed. On the other hand, they can be applied at higher solids content, in the range 50% or even higher.

Coatings based on elastomers such as Viton and Neoprene provide excellent flexibility as well as satisfactory adhesion to the metallic glass. The Viton has outstanding elevated temperature resistance but high cost. The Neoprene is more limited with respect to high temperature exposure but is much lower in cost.

EXAMPLE 29

Elevated Temperature Aging Tests

Even though the elevated temperature aging characteristics of the metallic glass itself are limited, the elevated temperature aging characteristics of the coatings are of significance because of potential development of metallic glass with improved temperature stability intermittent elevated temperature exposure of the current product and the desirability of having coatings which will pass military specification tests at 125° C. We therefore set up tests in two ovens, one at 100° C. and the other at 125° C. The visual observations on these specimens at 300 hours and 650 hours are shown in Table 2.

At 100° C. at 300 hours, the epoxy coated specimens showed little or no color change (Examples 21–23). The vinyl formulations without the tin maleate stabilizer (Example 17 and 18) showed significant darkening, while the tin maleate stabilizer (Example 19 and 20) showed only a very slight color change. The Pelmor Viton Spray (Example 24) was black originally, so no color change could be observed. The Viton formulations (Example 25 and 26) showed moderate yellowing. And the Neoprene formulation (Example 27) showed slight brown discoloration. The polyurethane (Example 28) showed no color change nor did the pigmented vinyl formulation.

At 125° C. after 300 hours, the epoxy formulations showed some yellowing. Vinyl formulations all showed considerable darkening as did the Neoprene coating. The Viton formulation darkened slightly more than at 100° C. and the polyurethane showed some yellowing.

After 650 hours, the specimens were evaluated for both color change and embrittlement. At 100° C., in all cases, there was very slight additional color change from that at 300 hours at 100° C. The Neoprene formulation was the only one that showed any embrittlement and that was minor.

At 125° C. after 650 hours, the color changes from those at 300 hours were also minor. In most cases there was some indication of slight embrittlement, but in all cases the coating appeared to retain adequate bond and flexibility.

It is significant that the differences in color between 300 hours and 650 hours at both 100° C. and 125° C. are minor. It appears that an initial color change occurs in the early portion of the aging but this change does not progress significantly.

It is claimed:

1. A method for adhesively bonding together the stands of a fabric composed of a glassy metal alloy which comprises applying a liquid polymeric adhesive curable to the solid state to the fabric, followed by curing the liquid adhesive to form a polymeric coating on the fabric.

2. The method for adhesively bonding as set forth in claim 1 wherein the adhesive cures to a flexible solid state and results in a flexible polymeric coated fabric.

3. The method for adhesively bonding as set forth in claim 1 wherein the liquid polymeric adhesive flows in the crevices between the strands.

4. The method for adhesively bonding as set forth in claim 1 wherein the liquid polymeric adhesive has a viscosity between about 0.3 cp and 1 cp.

5. The method for adhesively bonding as set forth in claim 1 wherein the liquid polymeric adhesive has a surface tension between about 18 dyn/cm and 30 dyn/cm.

6. The method for adhesively bonding as set forth in claim 1 wherein the liquid polymeric adhesive has a contact angle with the glassy metal alloy of between 0° and about 10°.

7. The method as set forth in claim 1 wherein the glassy metal alloy has a maximum permeability of at least about 25000 and a coercitivity of less than about 0.08 Oe.

8. The method as set forth in claim 1 wherein the glassy metal alloy comprises about 75 to 87 atom percent of one metal selected from the group consisting of iron and cobalt up to about three fourths of which may be replaced by nickel, and the balance at least one metalloid selected from the group consisting of boron, carbon, and phosphorus, up to about one third of which may be replaced by one element from the group consisting of silicon and aluminum, plus incidental impurities.

9. The method as set forth in claim 1 wherein the fabric is plain weave web.

10. A composite structure comprising: a fabric comprised of interlaced filaments of a glassy metal alloy and an adhesive binding overlapping filaments together.

11. The composite as set forth in claim 10 wherein the filaments consist essentially of a glassy metal alloy about 75-87 atom percent of at least one metal consisting of iron and cobalt, up to about three-fourths of which may be replaced by nickel, and the balance at least one metalloid selected from the group consisting of boron, carbon and phosphorous, up to one-third of which may be replaced by an element selected from the group consisting of silicon and aluminum plus incidental impurities.

12. The composite structure as set forth in claim 10 wherein the glassy metal alloy has the composition $Fe_{40}Ni_{40}P_{16}B_6$.

13. The composite structure as set forth in claim 10 wherein the adhesive is a polymer or copolymer of a member of the group consisting of vinyl chloride, vinyl acetate, epichlorohydrin, phenolformaldehyde and bisphenol A or a polyamide.

14. A fabric composed of a glassy metal alloy having a coating of a polymeric adhesive.

15. The fabric as set forth in claim 14 wherein the polymeric adhesive is an epoxy resin.

16. The fabric as set forth in claim 14 wherein the polymeric adhesive is a silicone.

17. The fabric as set forth in claim 14 bonded at elevated temperature to a polymeric adhesive.

18. The fabric as set forth in claim 14 wherein the polymeric adhesive is a mixture of a bisphenol-A resin and a polyamide.

19. The fabric as set forth in claim 14 wherein the polymeric adhesive is a polyester.

20. The fabric as set forth in claim 14 wherein the polymeric adhesive is polyvinyl chloride.

21. The fabric as set forth in claim 14 wherein the polymeric adhesive is a copolymer of vinyl chloride and vinyl acetate.

22. The fabric as set forth in claim 14 wherein the polymeric adhesive is plasticized with a plasticizer.

* * * * *